United States Patent
Eyring (10) Patent No.: US 11,481,922 B2
(45) Date of Patent: Oct. 25, 2022

(54) ONLINE NAVIGATIONAL DRIFT CORRECTION FOR METROLOGY MEASUREMENTS

(71) Applicant: KLA CORPORATION, Milpitas, CA (US)

(72) Inventor: Stefan Eyring, Weilburg (DE)

(73) Assignee: KLA CORPORATION, Milpitas, CA (US)

( * ) Notice: Subject to any disclaimer, the term of this patent is extended or adjusted under 35 U.S.C. 154(b) by 33 days.

(21) Appl. No.: 16/841,813

(22) Filed: Apr. 7, 2020

(65) Prior Publication Data

US 2021/0312656 A1 Oct. 7, 2021

(51) Int. Cl.
G06T 7/73 (2017.01)
G03F 7/20 (2006.01)
G06T 7/00 (2017.01)

(52) U.S. Cl.
CPC ............ *G06T 7/74* (2017.01); *G03F 7/70483* (2013.01); *G06T 7/001* (2013.01); *G06T 2207/30148* (2013.01)

(58) Field of Classification Search
None
See application file for complete search history.

(56) References Cited

U.S. PATENT DOCUMENTS

| | | | | |
|---|---|---|---|---|
| 2012/0191236 A1* | 7/2012 | Ausschnitt | ............ | G03F 7/705 |
| | | | | 700/105 |
| 2015/0043803 A1* | 2/2015 | Jeong | ...................... | G06K 9/74 |
| | | | | 382/149 |
| 2015/0154746 A1 | 6/2015 | Zafar et al. | | |
| 2017/0337673 A1 | 11/2017 | Tseng et al. | | |
| 2019/0086810 A1* | 3/2019 | Tel | ...................... | G03F 7/70625 |
| 2019/0094680 A1* | 3/2019 | Huang | ...................... | G03F 1/36 |
| 2019/0146328 A1* | 5/2019 | Huang | ...................... | G03F 1/36 |
| | | | | 430/5 |
| 2019/0196334 A1* | 6/2019 | Tel | ...................... | G03F 7/70633 |
| 2019/0204755 A1* | 7/2019 | Kicken | ............... | G03F 7/70633 |
| 2019/0310080 A1 | 10/2019 | Hill et al. | | |

(Continued)

FOREIGN PATENT DOCUMENTS

| WO | 2015101458 A1 | 7/2015 |
|---|---|---|
| WO | 2019166201 A1 | 9/2019 |

OTHER PUBLICATIONS

WIPO, International Search Report for International Application No. PCT/US2021/025685, dated Jul. 15, 2021.

*Primary Examiner* — Ian L Lemieux
(74) *Attorney, Agent, or Firm* — Hodgson Russ LLP (57) ABSTRACT

A field-of-view at a first modeled target location of a first target disposed on a specimen can be configured, which can include moving the stage relative to the detector. The first modeled target location is determined by summing a first design target location and a navigational error provided by an online model. A first image of the field-of-view is grabbed using the detector. The field-of-view at a second modeled target location of a second target disposed on the specimen is configured. Concurrent with configuring the field-of-view at the second modeled target location, using a processor, the position of a first actual target location is determined using the first image. The online model is updated with a difference between the first design target location and the first actual target location.

20 Claims, 6 Drawing Sheets

(56) References Cited

U.S. PATENT DOCUMENTS

| | | | |
|---|---|---|---|
| 2019/0339211 A1* | 11/2019 | Huijgen | G03F 7/705 |
| 2019/0361358 A1* | 11/2019 | Tel | G03F 7/70633 |
| 2020/0124984 A1* | 4/2020 | Chang | G06F 30/398 |
| 2020/0173940 A1* | 6/2020 | Kooiman | G06T 7/001 |
| 2020/0264514 A1* | 8/2020 | Coskun | G03F 7/70516 |
| 2020/0310242 A1* | 10/2020 | Van Haren | G03F 7/70641 |
| 2021/0191272 A1* | 6/2021 | Buhl | G01N 21/9505 |

\* cited by examiner

FIG. 1

(PRIOR ART)

ONLINE NAVIGATIONAL DRIFT CORRECTION FOR METROLOGY MEASUREMENTS

FIELD OF THE DISCLOSURE

The disclosure generally relates to semiconductor manufacturing.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it determines the return-on-investment for a semiconductor manufacturer.

Metrology systems rely on a stage's movement accuracy to meet process requirements. Such movement may include the stage's movement to the position necessary to perform a measurement of interest (e.g., an overlay target). The expected position of an element on the wafer design (i.e., the design position) may be slightly different from the real position (i.e., the measured position).

Several causes for this mismatch may exist: real wafer errors, which may be caused by, for example, the wafer fabrication process; inherent inaccuracy of stage motion, which may be caused by, for example, its position encoders or actuators; or drift effects of the wafer as relative to the stage during measurement, which may be caused by, for example, dissimilar thermal expansion (i.e., thermal drift).

When placing a wafer onto a metrology tool for inspection, the wafer and the metrology tool may be at different temperatures. The metrology tool also may be at a different temperature from the wafer during fabrication.

Figure 1:
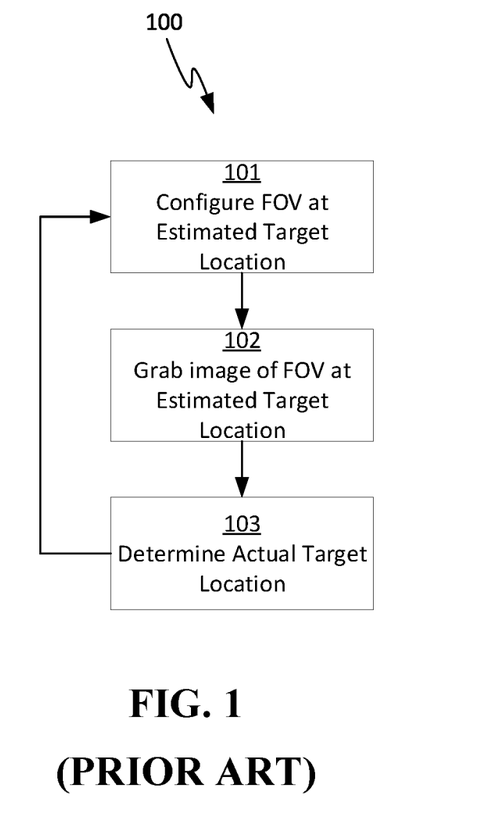
FIG. 1 illustrates a method according to the prior art.

Previously, a static model for drift has been employed. In such a model, a calculation has been made based on assumed drift (e.g., due to heating, cooling, or temperature differentials) of a metrology tool and a wafer, and the estimated position of elements on the wafer (e.g., targets) has been compensated for. Such a model is illustrated in FIG. 1, wherein method 100 may include first configuring a field-of-view (FOV) of a tool at an estimated target location at 101. Then, at 102, an image of the wafer within the FOV at the estimated target location may be grabbed. At 103, the image may be processed to determine the actual location of the target within the FOV. Finally, the difference between the actual target location and the estimated target location may be used to estimate the next target location to which the FOV is to be configured.

However, this model suffers from the drawback of inaccuracy. First, it assumes the target's actual location is within the FOV. If the target's actual location is not within the FOV, a search around the FOV is performed in addition to the search within the FOV. Frequently, a wafer's temperature is transient, and thus there may not be a practically definable wafer temperature and the thermal drift may not be practical to calculate on the order of the total inspection time. Additionally, the expansion or contraction of the wafer may be on a time scale on the order of the measurement itself, and thus a static model for thermal expansion does not enable continuously accurate position information. Further, this model does not consider other sources of navigational drift and error, such as warpage.

Therefore, improved methods and systems of locating and measuring targets are needed.

SUMMARY OF THE DISCLOSURE

A method is provided in a first embodiment. The method comprises providing a tool that includes a detector and a stage for holding a specimen. Using the tool, a field-of-view at a first modeled target location of a first target disposed on the specimen is configured. The first modeled target location is determined by summing a first design target location and a navigational error provided by an online model. Configuring the field-of-view comprises moving the stage relative to the detector. A first image of the field-of-view is grabbed using the detector.

The field-of-view at a second modeled target location of a second target disposed on the specimen is configured. The second modeled target location is determined by summing a second design target location and the navigational error provided by the online model. Concurrent with configuring the field-of-view at the second modeled target location, using a processor the position of a first actual target location using the first image is determined and the online model is updated with a difference between the first design target location and the first actual target location. The processor is in electronic communication with the tool.

The method can further comprise, after configuring the field-of-view at the second modeled target location, grabbing a second image of the field-of-view using the detector of the tool. The field-of-view at a third modeled target location of a third target disposed on the specimen is configured. The third modeled target location is determined by summing a third design target location and the navigational error provided by the online model. Concurrent with configuring the field-of-view at the third modeled target location, the position of a second actual target location using the second image is determined using the processor. The online model is updated with a difference between the second design target location and the second actual target location.

In an instance, configuring the field-of-view at the third modeled target location is after updating the online model with the difference between the first design target location and the first actual target location. In another instance, configuring the field-of-view at the third modeled target location is before updating the online model with the difference between the first design target location and the first actual target location.

The online model can be the updated using secondary data.

Moving the stage relative to the detector can include using an actuator to move the stage or the detector.

The detector can include an optical image detector and grabbing the first image can include receiving photons at the detector.

The detector can include an electron detector and grabbing the first image can include receiving electrons at the detector.

Using the first image, the overlay can be measured for the first target.

A system is provided in a second embodiment. The system comprises a stage for holding a specimen and a detector. The specimen has a first target and a second target disposed thereon. The system configures a field-of-view at a first modeled target location of the first target, grab a first image of the field-of-view using the detector, and configure the field-of-view at a second modeled target location at the second target. The first modeled target location is determined by summing a first design target location and a navigational error provided by an online model. The second modeled target location is determined by summing a second design target location and the navigational error provided by the online model. Configuring the field-of-view comprises moving the stage relative to the detector. The system further includes a processor configured to, concurrent with configuring the field-of-view at the second modeled target location, determine the position of a first actual target location using the first image and update the online model with a difference between the first design target location and the first actual target location. The processor is in electronic communication with the detector.

The system can be further configured to, after configuring the field-of-view at the second modeled target location, grab a second image of the field-of-view using the detector and configure the field-of-view at a third modeled target location of a third target disposed on the specimen. The third modeled target location is determined by summing a third design target location and the navigational error provided by the online model. The processor is further configured to, concurrent with configuring the field-of-view at the third modeled target location, determine the position of a second actual target location using the second image and update the online model with a difference between the second design target location and the second actual target location.

In an instance, the system further configures the field-of-view at the third modeled target location after updating the online model with the difference between the first design target location and the first actual target location. In another instance, the system further configures the field-of-view at the third modeled target location before updating the online model with the difference between the first design target location and the first actual target location.

The processor can be configured to update the online model using secondary data.

The system can further include an actuator operatively connected to the stage or the detector. The actuator is configured to move the stage relative to the detector.

The detector can include an optical image detector configured to grab the first image by receiving photons.

The detector can include an electron detector configured to grab the first image by receiving electrons.

The processor can be further configured to, using the first image, measure the overlay for the first target.

A non-transitory, computer-readable storage medium containing one or more programs in a third embodiment. The one or more programs are configured to execute the following steps on one or more processors. A tool comprising a detector and a stage for holding a specimen, the specimen having a first target and a second target disposed thereon is instructed to perform the following steps. A field-of-view at a first modeled target location of the first target is configured. The first modeled target location is determined by summing a first design target location and a navigational error provided by an online model. A first image of the field-of-view is grabbed using the detector. The field-of-view at a second modeled target location of the second target is configured. The second modeled target location is determined by summing a second design target location and the navigational error provided by the online model. Configuring the field-of-view comprises moving the stage relative to the detector. Concurrent with configuring the field-of-view at the second modeled target location, the position of a first actual target location using the first image is determined and the online model is updated with a difference between the first design target location and the first actual target location.

The one or more programs can be configured to further execute the following steps on the one or more processors after configuring the field-of-view at the second modeled target location. The tool can be instructed to grab a second image of the field-of-view using the detector and configure the field-of-view at a third modeled target location of a third target disposed on the specimen. The third modeled target location is determined by summing a third design target location and the navigational error provided by the online model. Concurrent with configuring the field-of-view at the third modeled target location, the position of a second actual target location using the second image is determined and the online model is updated with a difference between the second design target location and the second actual target location.

BRIEF DESCRIPTION OF THE FIGURES

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Embodiments disclosed herein include methods, systems, and apparatuses for metrology (e.g., overlay metrology) having improved navigational accuracy. Embodiments may perform online monitoring and correction for drift effects (e.g., thermal drift) on a specimen (e.g., specimens 502 or 604) held on a stage. Methods (e.g., methods 300 or 400) disclosed herein may be performed using, for example, optical or e-beam systems (e.g., systems 500 or 600). Systems (e.g., systems 500 or 600) disclosed herein may include, for example, optical or e-beam systems (e.g., systems 500 or 600). Apparatuses disclosed herein may be configured to interface with, for example, optical or e-beam systems (e.g., systems 500 or 600).

Embodiments according to the present disclosure may enable greater accuracy by using actual target (e.g., semiconductor metrology target) locations, rather than measuring thermal drift alone or using comparative targets. One portion of the parallel process involves performing configuration of a FOV to targets and grabbing images of the FOV (e.g., the "move-and-grab").

Figure 3:
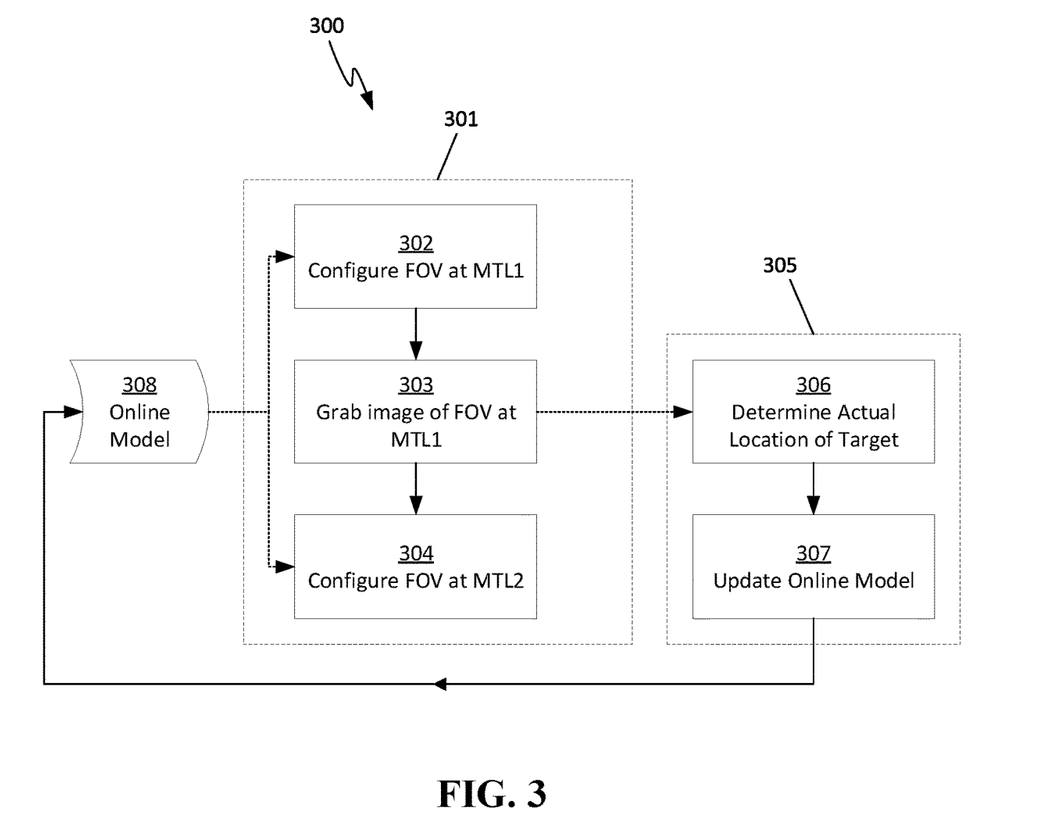
FIG. 3 illustrates an example embodiment of a method of the present disclosure.

Processing the images to determine navigation error and using the same to update an online model (e.g., online model 308) may be done in parallel to the move-and-grabs. While the move-and-grabs pull data from the online model for forming a model target location, the online model is updated as the data becomes available from the parallel processing and update. Thus, various move-and-grabs may pull data from different versions of the online model. The processing of the images to update an online model in parallel to the move-and-grab process enables speedy scans that do not have to wait for processing from the previous grabbed image to be completed. Data is obtained from the online model to use in the movements as needed, and is updated as the update becomes available.

By being online, the model may be stored on a server outside of the tool. This can be in a semiconductor manufacturing facility or in the cloud.

The parallel image processing may include finding the exact actual location of a target within the grabbed image, determining a navigation error $\vec{e}$—corresponding to the error of the online model's prediction—from the actual location and the predicted location of the target, and using the navigation error $\vec{e}$ to update the online model.

Figure 2:
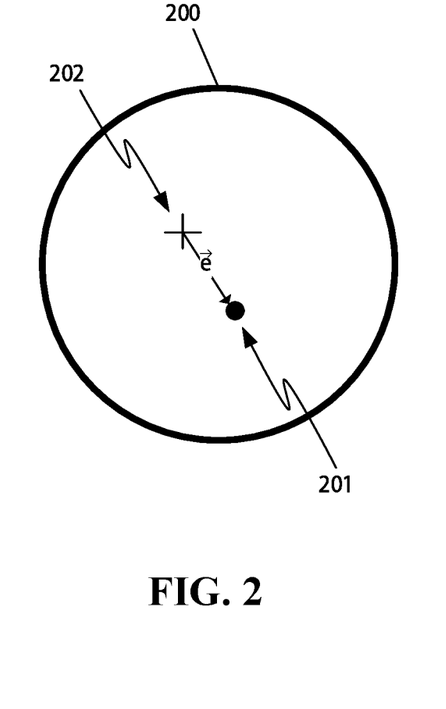
FIG. 2 illustrates an example specimen having a modeled target location and an actual target location.

With reference to FIG. 2, when grabbing an image of a specimen (e.g., a wafer, die, or any portion thereof) held on a stage, such as specimen 200, a location, such as a modeled target location (MTL) 201, may be the expected position of a target and may be used for locating a FOV. However, an actual location of the target, such as an actual target location (ATL) 202, may be different from the modeled target location 201 by a navigation error $\vec{e}$. The navigation error $\vec{e}$ may be determined using an image grabbed from the FOV if the ATL 202 and the MTL 201 are both in the frame. Embodiments of the present disclosure may determine and utilize this navigational error $\vec{e}$ to update an online model, which may be used in FOV configurations to move to a MTL more accurate to the ATL.

The measured value can be the modeled value plus error. A correction term can be used for summing and reducing the error. Thus, the modeled value can be a design plus a correction term.

In an example, compensation is based on a linear first order polynomial model (e.g., translation, scale, rotation, skew). The first order polynomial can be fitted to the available data. Thus, $MTL_x=a_{00}+a_{10}x+a_{01}y$ and $MTL_y=b_{00}+b_{10}x+b_{01}y$. A fit can be performed using multitudes of ATL. The model can be applied to each DTL coordinate (x, Y) to obtain the MTL. An update can be performed by adding a newly-detected error to the pool of data and performing the fit again.

The concurrent image processing may further include measuring overlay on the target using the grabbed image. Since the online model is used to determine the MTL, use of the MTL enables faster and more accurate overlay measurements (i.e., the measure of a lithographic process or system's ability to print layers accurately on top of each other) compared to previous methods and systems. Further, considerations not discernable using previous methods, such as warpage, can be accounted for. Further, by increasing the number of sampling points used to create the model, which may exceed 30 during move-and-grab in some embodiments of the present disclosure, higher-order models may be used compared to an estimated model under previous methods, which may only employ 3-5 sampling points for the specimen alignment (i.e., not during move-and-grab).

The overlap between steps during concurrent image processing may depend on tool speed and complexity. In an instance, move time may be 0.2 seconds and image processing may be on the same order of magnitude as move time.

Processing the image and updating the online model concurrent with the move-and-grab allows the move-and-grabs to proceed without having to wait for the image to be processed or the online model updated. For the move-and-grab and the image processing and updating to be concurrent, these processes may overlap partially or fully. In other words, an nth image may begin to be processed and used to update the online model immediately after grabbing of the nth image, and the n+1th move-and-grab may also proceed immediately after the grabbing of the nth image. The processing of the nth image and the online model update resulting therefrom may be completed during the n+1th move-and-grab or after the n+1th move-and-grab. For example, the processing of the nth image and the online model update resulting therefrom may be complete prior to the n+mth move-and-grab. In this example, the processing of the nth image and the online model update resulting therefrom is concurrent with the n+1th through the n+(m−1)th move-and-grabs. As such, the updated online model may be used by the n+mth move-and-grab, upon completion of the update. Thus, the nth image is processed and the online model is updated concurrently with the n+1th move-and-grab.

Accordingly, a navigation error from the first target may be determined and used to update the online model prior to the second move-and-grab, after the second move-and-grab, and may not be available until an nth move-and-grab.

Figure 5:
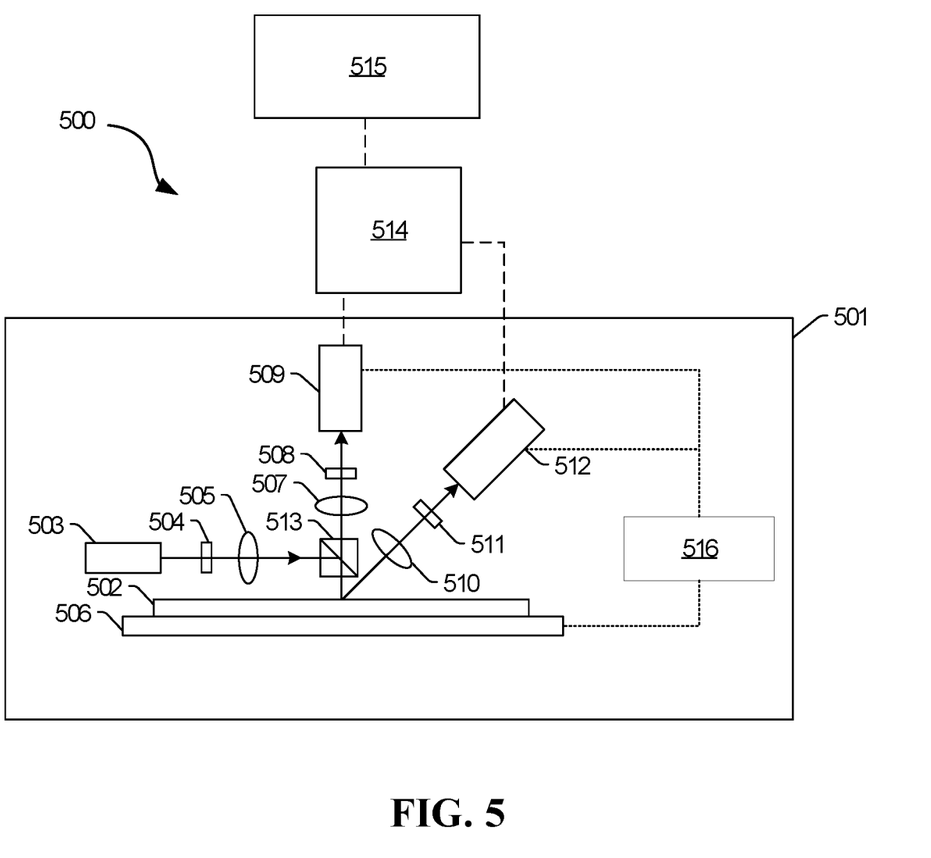
FIG. 5 illustrates an example embodiment of an optical system of the present disclosure having an optical tool.
Figure 6:
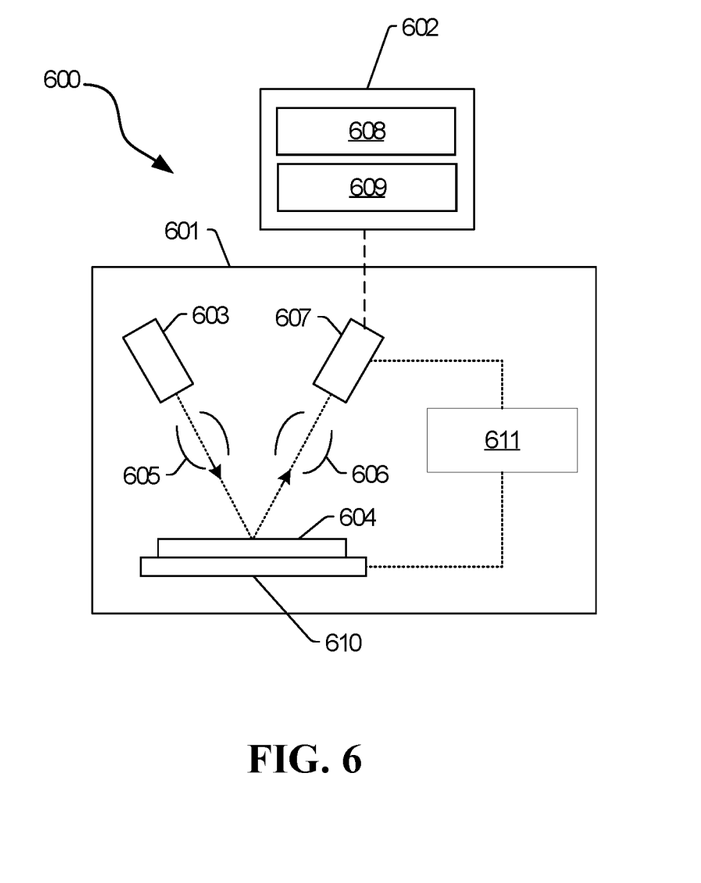
FIG. 6 illustrates an example embodiment of an electron beam (e-beam) system of the present disclosure having an e-beam tool.

In an embodiment, a method 300 may utilize a tool (e.g., optical based subsystem 501 or the wafer inspection tool of system 600) and a processor (e.g., processor 514 or 608). 302, 303, and 304 of the method 300 may be performed using the tool at 301. 306 and 307 may be performed using the processor at 305. It should be noted that the processor may also be used for various steps interfacing with the tool at 301 or delivering the online model 308. The tool used at 301 may comprise a detector (e.g., detector 509, 512, or 607) and a stage (e.g., stage 506 or 610). A specimen (e.g., specimen 502 or 604) may be held on the stage. For example, a first target and a second target may be disposed on the specimen.

The method may comprise, at 302, configuring a FOV at a first MTL of the first target using the tool. The first MTL may be determined by summing a first design target location (DTL) and a navigational error provided by an online model 308. The summation of the first design target location and the navigational error may be a vector summation, provided that both are vector quantities.

Configuring the FOV may comprise moving the stage relative to the detector. It should be understood that the stage, the detector, or both the stage and the detector may move such that the stage moves relative to the detector. Additionally, in embodiments employing optical inspection, it should be understood that one or more of the optical components of an optical based subsystem (e.g., optical based subsystem 501) may move in order to move the stage relative to the detector. Additionally embodiments employing e-beam inspection (e.g., system 600), it should be understood that the electron beam may move (e.g., by magnetic bending) to move the stage relative to the detector.

At 303, a first image of the FOV may be grabbed using the detector.

At 304, the FOV may be configured at a second MTL of the second target using the tool. The second MTL may be determined by summing a second DTL and the navigational error provided by the online model 308. Configuring the FOV may comprise moving the stage relative to the detector.

The processor used at 305 may be in electronic communication with the tool used at 301. Concurrent with configuring the FOV at the second MTL, at 305, the processor may, at 306, determine the position of a first ATL using the first image. The processor may, at 307, update the online model 308 with a difference between the first DTL and the first ATL.

Figure 4:
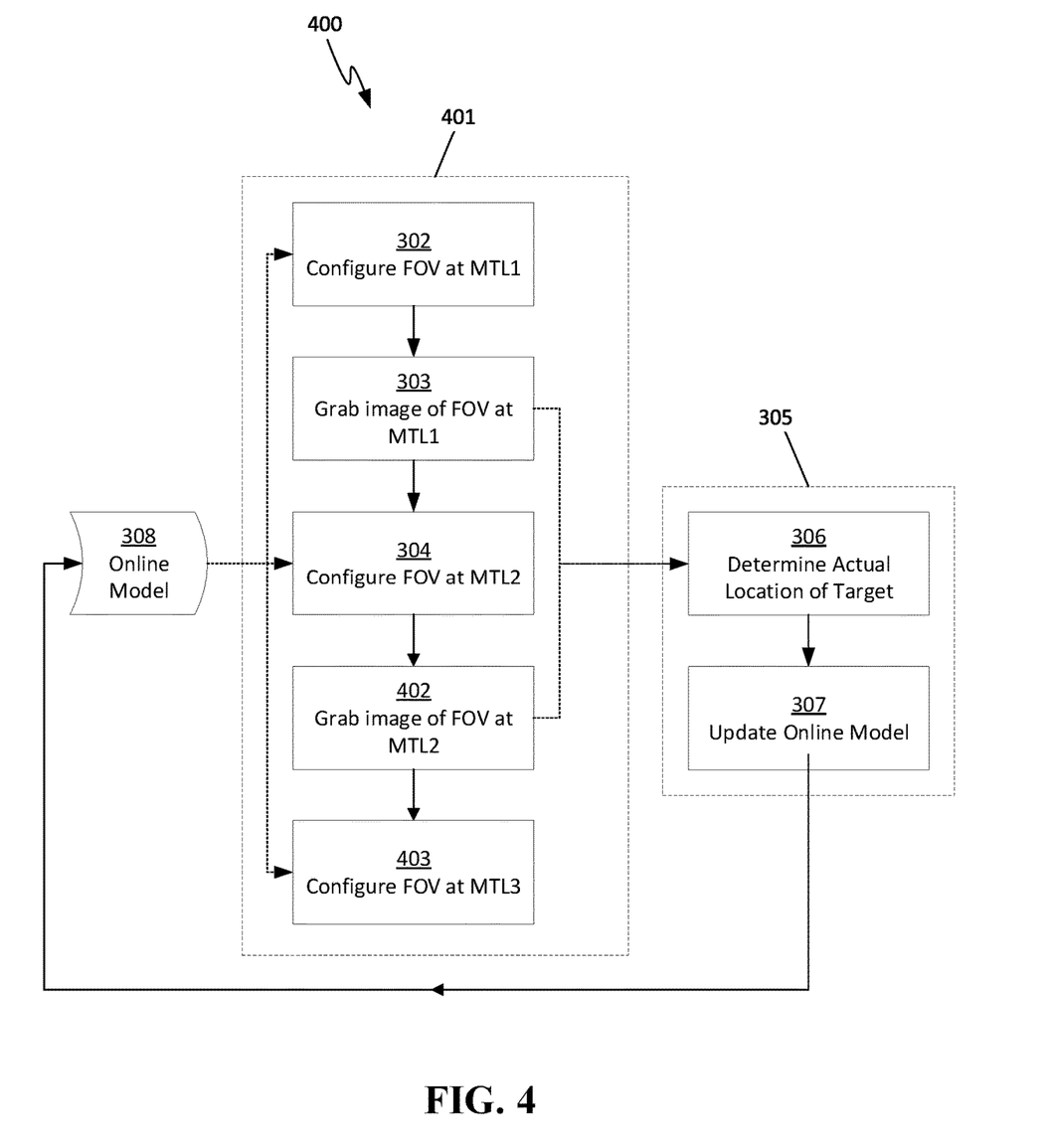
FIG. 4 illustrates an example embodiment of a method of the present disclosure similar to and extended from FIG. 3.

With reference to FIG. 4, in another embodiment, a method 400 may be performed similar to method 300. Like method 300, method 400 may utilize a tool at 401 (similar to 301) and a processor at 305. 302, 303, 304, 402, and 403 of the method 300 may be performed using the tool at 401. 306 and 307 may be performed using the processor at 305. It should be noted that the processor may also be used for various steps interfacing with the tool at 401 or delivering the online model 308. The tool used at 401 may comprise a detector and a stage, similar to the tool used at 301. A specimen may be disposed on the stage. For example, a first target and a second target may be disposed on the specimen. 302, 303, 304, 306, 307, and 308 may be similar to their counterparts in method 300.

After configuring the FOV at the second MTL at 304, at 402, using the tool at 401 and the processor at 305, a second image of the FOV may be grabbed using the detector.

At 403, the FOV may be configured at a third MTL of a third target disposed on the specimen using the tool. The third MTL may be determined by summing a third DTL and the navigational error provided by the online model 308. Configuring the FOV may comprise moving the stage relative to the detector.

Concurrent with configuring the FOV at the third MTL, at 305 the processor, at 306, may determine the position of a second ATL using the second image. The processor, at 307, may update the online model 308 with a difference between the second DTL and the second ATL.

In some embodiments, configuring the FOV to the third MTL at 403 may be before or after updating the online model 308 with the difference between the first DTL and the first ATL at 307.

In some embodiments, secondary data may be used at 307 to update the online model 308. Secondary data can include theoretical drift models, dedicated drift measurements at given intervals (e.g., every tenth stage move) on dedicated targets, or other information.

In some embodiments, the detector of the tool used at 301 or 401 may be an optical image detector (e.g., detector 509 or 512). In such embodiments, grabbing the first image at 303, or grabbing the second image at 402, may include receiving photons at the detector. The detector may be, for example, a charge-coupled device (CCD), a complementary metal-oxide-semiconductor (CMOS) camera, a time-delay and integration (TDI) sensor, or other digital cameras.

In some embodiments, the detector of the tool used at 301 or 401 may be an electron detector (e.g., detector 607). In such embodiments, grabbing the first image at 303, or grabbing the second image at 402, may include receiving electrons at the detector. The detector may be, for example, an electron detector such as an Everhart-Thornley detector. Scanning techniques can be included when generating images.

In some embodiments, the images may be used to measure overlay for the respective target.

Additional embodiments include systems 500 and 600, illustrated in FIG. 5 and FIG. 6, respectively.

One embodiment of a system 500 is shown in FIG. 5. The system 500 may include optical based subsystem 501. In general, the optical based subsystem 501 may be configured for generating optical based output for a specimen 502 by directing light to (or scanning light over) and detecting light from the specimen 502. In one embodiment, the specimen 502 may include a wafer. The wafer may include any wafer known in the art. In another embodiment, the specimen 502 may include a reticle. The reticle may include any reticle known in the art.

In the embodiment of the system 500 shown in FIG. 5, optical based subsystem 501 may include an illumination subsystem configured to direct light to specimen 502. The illumination subsystem may include at least one light source. For example, as shown in FIG. 5, the illumination subsystem may include light source 503. In one embodiment, the illumination subsystem may be configured to direct the light to the specimen 502 at one or more angles of incidence, which may include one or more oblique angles and/or one or more normal angles. For example, as shown in FIG. 5, light from light source 503 may be directed through optical element 504 and then lens 505 to specimen 502 at an oblique angle of incidence. The oblique angle of incidence may include any suitable oblique angle of incidence, which may vary depending on, for instance, characteristics of the specimen 502.

The optical based subsystem 501 may be configured to direct the light to the specimen 502 at different angles of incidence at different times. For example, the optical based subsystem 501 may be configured to alter one or more characteristics of one or more elements of the illumination subsystem such that the light can be directed to the specimen 502 at an angle of incidence that is different from that shown in FIG. 5. In one such example, the optical based subsystem 501 may be configured to move light source 503, optical element 504, and lens 505 such that the light is directed to the specimen 502 at a different oblique angle of incidence or a normal (or near normal) angle of incidence.

In some instances, the optical based subsystem 501 may be configured to direct light to the specimen 502 at more than one angle of incidence at the same time. For example, the illumination subsystem may include more than one illumination channel, one of the illumination channels may include light source 503, optical element 504, and lens 505 as shown in FIG. 5 and another of the illumination channels (not shown) may include similar elements, which may be configured differently or the same, or may include at least a light source and possibly one or more other components such as those described further herein. If such light is directed to the specimen at the same time as the other light, one or more characteristics (e.g., wavelength, polarization, etc.) of the light directed to the specimen 502 at different angles of incidence may be different such that light resulting from illumination of the specimen 502 at the different angles of incidence can be discriminated from each other at the detector(s).

In another instance, the illumination subsystem may include only one light source (e.g., light source 503 shown in FIG. 5) and light from the light source may be separated into different optical paths (e.g., based on wavelength, polarization, etc.) by one or more optical elements (not shown) of the illumination subsystem. Light in each of the different optical paths may then be directed to the specimen

502. Multiple illumination channels may be configured to direct light to the specimen 502 at the same time or at different times (e.g., when different illumination channels are used to sequentially illuminate the specimen). In another instance, the same illumination channel may be configured to direct light to the specimen 502 with different characteristics at different times. For example, in some instances, optical element 504 may be configured as a spectral filter and the properties of the spectral filter can be changed in a variety of different ways (e.g., by swapping out the spectral filter) such that different wavelengths of light can be directed to the specimen 502 at different times. The illumination subsystem may have any other suitable configuration known in the art for directing the light having different or the same characteristics to the specimen 502 at different or the same angles of incidence sequentially or simultaneously.

In one embodiment, light source 503 may include a broadband plasma (BBP) source. In this manner, the light generated by the light source 503 and directed to the specimen 502 may include broadband light. However, the light source may include any other suitable light source such as a laser. The laser may include any suitable laser known in the art and may be configured to generate light at any suitable wavelength or wavelengths known in the art. In addition, the laser may be configured to generate light that is monochromatic or nearly-monochromatic. In this manner, the laser may be a narrowband laser. The light source 503 may also include a polychromatic light source that generates light at multiple discrete wavelengths or wavebands.

Light from optical element 504 may be focused onto specimen 502 by lens 505. Although lens 505 is shown in FIG. 5 as a single refractive optical element, it is to be understood that, in practice, lens 505 may include a number of refractive and/or reflective optical elements that in combination focus the light from the optical element to the specimen. The illumination subsystem shown in FIG. 5 and described herein may include any other suitable optical elements (not shown). Examples of such optical elements include, but are not limited to, polarizing component(s), spectral filter(s), spatial filter(s), reflective optical element(s), apodizer(s), beam splitter(s) (such as beam splitter 513), aperture(s), and the like, which may include any such suitable optical elements known in the art. In addition, the optical based subsystem 501 may be configured to alter one or more of the elements of the illumination subsystem based on the type of illumination to be used for generating the optical based output.

The optical based subsystem 501 may also include a scanning subsystem configured to cause the light to be scanned over the specimen 502. For example, the optical based subsystem 501 may include stage 506 on which specimen 502 is disposed during optical based output generation. The scanning subsystem may include any suitable mechanical and/or robotic assembly (that includes stage 506) that can be configured to move the specimen 502 such that the light can be scanned over the specimen 502. In addition, or alternatively, the optical based subsystem 501 may be configured such that one or more optical elements of the optical based subsystem 501 perform some scanning of the light over the specimen 502. The light may be scanned over the specimen 502 in any suitable fashion such as in a serpentine-like path or in a spiral path.

The optical based subsystem 501 may further include one or more detection channels. At least one of the one or more detection channels may include a detector configured to detect light from the specimen 502 due to illumination of the specimen 502 by the subsystem and to generate output responsive to the detected light. For example, the optical based subsystem 501 shown in FIG. 5 may include two detection channels, one formed by collector 507, element 508, and detector 509 and another formed by collector 510, element 511, and detector 512. As shown in FIG. 5, the two detection channels may be configured to collect and detect light at different angles of collection. In some instances, both detection channels may be configured to detect scattered light, and the detection channels may be configured to detect light that is scattered at different angles from the specimen 502. However, one or more of the detection channels may be configured to detect another type of light from the specimen 502 (e.g., reflected light).

As further shown in FIG. 5, both detection channels are shown positioned in the plane of the paper and the illumination subsystem is also shown positioned in the plane of the paper. Therefore, in this embodiment, both detection channels may be positioned in (e.g., centered in) the plane of incidence. However, one or more of the detection channels may be positioned out of the plane of incidence. For example, the detection channel formed by collector 510, element 511, and detector 512 may be configured to collect and detect light that is scattered out of the plane of incidence. Therefore, such a detection channel may be commonly referred to as a "side" channel, and such a side channel may be centered in a plane that is substantially perpendicular to the plane of incidence.

Although FIG. 5 shows an embodiment of the optical based subsystem 501 that includes two detection channels, the optical based subsystem 501 may include a different number of detection channels (e.g., only one detection channel or two or more detection channels). In one such instance, the detection channel formed by collector 510, element 511, and detector 512 may form one side channel as described above, and the optical based subsystem 501 may include an additional detection channel (not shown) formed as another side channel that is positioned on the opposite side of the plane of incidence. Therefore, the optical based subsystem 501 may include the detection channel that includes collector 507, element 508, and detector 509 and that is centered in the plane of incidence and configured to collect and detect light at scattering angle(s) that are at or close to normal to the specimen 502 surface. This detection channel may therefore be commonly referred to as a "top" channel, and the optical based subsystem 501 may also include two or more side channels configured as described above. As such, the optical based subsystem 501 may include at least three channels (i.e., one top channel and two side channels), and each of the at least three channels may have its own collector, each of which may be configured to collect light at different scattering angles than each of the other collectors.

As described further above, each of the detection channels included in the optical based subsystem 501 may be configured to detect scattered light. Therefore, the optical based subsystem 501 shown in FIG. 5 may be configured for dark field (DF) output generation for specimens 502. However, the optical based subsystem 501 may also or alternatively include detection channel(s) that are configured for bright field (BF) output generation for specimens 502. In other words, the optical based subsystem 501 may include at least one detection channel that is configured to detect light specularly reflected from the specimen 502. Therefore, the optical based subsystems 501 described herein may be configured for only DF, only BF, or both DF and BF imaging. Although each of the collectors are shown in FIG. 5 as single refractive optical elements, it is to be understood that each of the collectors may include one or more refractive optical die(s) and/or one or more reflective optical element(s).

The one or more detection channels may include any suitable detectors known in the art. For example, the detectors may include photo-multiplier tubes (PMTs), charge coupled devices (CCDs), time delay integration (TDI) cameras, and any other suitable detectors known in the art. The detectors may also include non-imaging detectors or imaging detectors. In this manner, if the detectors are non-imaging detectors, each of the detectors may be configured to detect certain characteristics of the scattered light such as intensity but may not be configured to detect such characteristics as a function of position within the imaging plane. As such, the output that is generated by each of the detectors included in each of the detection channels of the optical based subsystem may be signals or data, but not image signals or image data. In such instances, a processor such as processor 514 may be configured to generate images of the specimen 502 from the non-imaging output of the detectors. However, in other instances, the detectors may be configured as imaging detectors that are configured to generate imaging signals or image data. Therefore, the optical based subsystem may be configured to generate optical images or other optical based output described herein in a number of ways.

It is noted that FIG. 5 is provided herein to generally illustrate a configuration of an optical based subsystem 501 that may be included in the system embodiments described herein or that may generate optical based output that is used by the system embodiments described herein. The optical based subsystem 501 configuration described herein may be altered to optimize the performance of the optical based subsystem 501 as is normally performed when designing a commercial output acquisition system.

In another embodiment, FIG. 6 is a block diagram of an embodiment of a system 600. The system 600 includes a wafer inspection tool or metrology tool (which includes the electron column 601) configured to generate images of a specimen 604 (e.g., a wafer).

The wafer inspection tool may include an output acquisition subsystem that includes at least an energy source and a detector. The output acquisition subsystem may be an electron beam-based output acquisition subsystem. For example, in one embodiment, the energy directed to the specimen 604 may include electrons, and the energy detected from the specimen 604 may include electrons. In this manner, the energy source may be an electron beam source. In one such embodiment shown in FIG. 6, the output acquisition subsystem may include electron column 601, which may be coupled to computer subsystem 602. A stage 610 may hold the specimen 604. In one embodiment, the specimen 604 may include a wafer. The wafer may include any wafer known in the art. In another embodiment, the specimen 604 may include a reticle. The reticle may include any reticle known in the art.

As also shown in FIG. 6, the electron column 601 may include an electron beam source 603 configured to generate electrons that are focused to specimen 604 by one or more elements 605. The electron beam source 603 may include, for example, a cathode source or emitter tip. The one or more elements 605 may include, for example, a gun lens, an anode, a beam limiting aperture, a gate valve, a beam current selection aperture, an objective lens, and a scanning subsystem, all of which may include any such suitable elements known in the art.

Electrons returned from the specimen 604 (e.g., secondary electrons and/or backscattered electrons) may be focused by one or more elements 606 to detector 607. One or more elements 606 may include, for example, a scanning subsystem, which may be the same scanning subsystem included in element(s) 605.

The electron column 601 also may include any other suitable elements known in the art.

Although the electron column 601 is shown in FIG. 6 as being configured such that the electrons are directed to the specimen 604 at an oblique angle of incidence and are scattered from the specimen 604 at another oblique angle, the electron beam may be directed to and scattered from the specimen 604 at any suitable angles. In addition, the electron beam-based output acquisition subsystem may be configured to use multiple modes to generate images of the specimen 604 (e.g., with different illumination angles, collection angles, etc.). The multiple modes of the electron beam-based output acquisition subsystem may be different in any image generation parameters of the output acquisition subsystem.

Computer subsystem 602 may be coupled to detector 607 as described above. The detector 607 may detect electrons returned from the surface of the specimen 604 thereby forming electron beam images of the specimen 604. The electron beam images may include any suitable electron beam images. Computer subsystem 602 may be configured to perform any of the functions described herein using the output of the detector 607 and/or the electron beam images. Computer subsystem 602 may be configured to perform any additional step(s) described herein. A system 600 that includes the output acquisition subsystem shown in FIG. 6 may be further configured as described herein.

It is noted that FIG. 6 is provided herein to generally illustrate a configuration of an electron beam-based output acquisition subsystem that may be used in the embodiments described herein. The electron beam-based output acquisition subsystem configuration described herein may be altered to optimize the performance of the output acquisition subsystem as is normally performed when designing a commercial output acquisition system.

Although the output acquisition subsystem is described above as being an electron beam-based output acquisition subsystem, the output acquisition subsystem may be an ion beam-based output acquisition subsystem. Such an output acquisition subsystem may be configured as shown in FIG. 6 except that the electron beam source may be replaced with any suitable ion beam source known in the art. In addition, the output acquisition subsystem may be any other suitable ion beam-based output acquisition subsystem such as those included in commercially available focused ion beam (FIB) systems, helium ion microscopy (HIM) systems, and secondary ion mass spectroscopy (SIMS) systems.

The computer subsystem 602 includes a processor 608 and an electronic data storage unit 609. The processor 608 may include a microprocessor, a microcontroller, or other devices.

In addition, the systems described herein, embodied as examples in FIGS. 5 and 6, may be implemented using an existing system (e.g., by adding functionality described herein to an existing system). For some such systems, the methods described herein may be provided as optional functionality of the system (e.g., in addition to other functionality of the system). Alternatively, the system described herein may be designed as a completely new system.

The processor 514 or computer subsystem 602 may be coupled to the components of the system 500 or the system 600, respectively, in any suitable manner (e.g., via one or more transmission media, which may include wired and/or wireless transmission media) such that the processor 514 or the processor 608, respectively, can receive output. The processor 514 or the processor 608 may be configured to perform a number of functions using the output. The system 500 or the wafer inspection tool of system 600 can receive instructions or other information from the processor 514 or the processor 608, respectively. The processor 514 or the processor 608 and/or the electronic data storage unit 515 or the electronic data storage unit 609, respectively, optionally may be in electronic communication with a wafer inspection tool, a wafer metrology tool, or a wafer review tool (not illustrated) to receive additional information or send instructions. For example, the processor 514 and/or the electronic data storage unit 515 can be in electronic communication with an SEM.

The processor 514 or computer subsystem 602 (including processor 608) may be in electronic communication with the wafer inspection tool, such as the detector 509 or the detector 607. The processor 514 or computer subsystem 602 may be configured to process images generated using measurements from the detector 607. For example, the processor 514 or computer subsystem 602 may perform embodiments of the methods 300 or 400, or sub-method 305.

The processor 514, the computer subsystem 602, or the processor 608, other system(s), or other subsystem(s) described herein may be part of various systems, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system(s) may include a platform with high-speed processing and software, either as a standalone or a networked tool.

The processor 514 or the processor 608 and the electronic data storage unit 515 or the electronic data storage unit 609, respectively, may be disposed in or otherwise part of the system 500 or system 600, respectively, or another device. In an example, the processor 514 or the processor 608 and the electronic data storage unit 515 or the electronic data storage unit 609, respectively, may be part of a standalone control unit or in a centralized quality control unit. Multiple processors 514 or processors 608 or electronic data storage units 515 or electronic data storage units 609, respectively, may be used.

The processor 514 or the processor 608 may be implemented in practice by any combination of hardware, software, and firmware. Also, its functions as described herein may be performed by one unit, or divided up among different components, each of which may be implemented in turn by any combination of hardware, software and firmware. Program code or instructions for the processor 514 or the processor 608 to implement various methods and functions may be stored in readable storage media, such as a memory in the electronic data storage unit 515 or the electronic data storage unit 609, respectively, or other memory.

If the system 500 or the system 600 includes more than one processor 514, computer subsystem 602, or processor 608, respectively, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 514 or the processor 608 may be configured to perform a number of functions using the output of the system 500 or the system 600, respectively, or other output. For instance, the processor 514 or the processor 608 may be configured to send the output to an electronic data storage unit 515 or the electronic data storage unit 509, respectively, or another storage medium. The processor 514 or the processor 608 may be further configured as described herein.

The processor 514, processor 608, or computer subsystem 602 may be part of a defect review system, an inspection system, a metrology system, or some other type of system. Thus, the embodiments disclosed herein may describe some configurations that can be tailored in a number of manners for systems having different capabilities that are more or less suitable for different applications.

If the system includes more than one subsystem, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 514 or the processor 608 may be configured according to any of the embodiments described herein. The processor 514 or the processor 608 also may be configured to perform other functions or additional steps using the output of the system 500 or the system 600, respectively, or using images or data from other sources.

The processor 514 or the processor 608 may be communicatively coupled to any of the various components or sub-systems of system 500 or system 600, respectively, in any manner known in the art. Moreover, the processor 514 or the processor 608 may be configured to receive and/or acquire data or information from other systems (e.g., inspection results from an inspection system such as a review tool, a remote database including design data and the like) by a transmission medium that may include wired and/or wireless portions. In this manner, the transmission medium may serve as a data link between the processor 513 or the processor 608 and other subsystems of the system 500 or the system 600, respectively, or systems external to system 500 or the system 600, respectively.

Various steps, functions, and/or operations of system 500 or system 600 and the methods disclosed herein are carried out by one or more of the following: electronic circuits, logic gates, multiplexers, programmable logic devices, ASICs, analog or digital controls/switches, microcontrollers, or computing systems. Program instructions implementing methods such as those described herein may be transmitted over or stored on carrier medium. The carrier medium may include a storage medium such as a read-only memory, a random access memory, a magnetic or optical disk, a non-volatile memory, a solid state memory, a magnetic tape, and the like. A carrier medium may include a transmission medium such as a wire, cable, or wireless transmission link. For instance, the various steps described throughout the present disclosure may be carried out by a single processor 514 or a single processor 608 (or computer subsystem 602), alternatively, multiple processors 514 or multiple processors 608 (or multiple computer subsystems 602). Moreover, different sub-systems of the system 500 or system 600 may include one or more computing or logic systems. Therefore, the above description should not be interpreted as a limitation on the present disclosure but merely an illustration.

In an instance, the system 500 (e.g. using optical based subsystem 501) or the system 600 (e.g., using the wafer inspection tool or electron column 601) may configure a FOV by moving the stage 506 or 610, respectively, relative to the detector 509, 512, or 607, respectively.

It should be understood that the stage 506 or 610, the detector 509, 512, or 607, or both the stage 506 or 610 and the detector 509, 512, or 607 may move to move the stage 506 or 610 relative to the detector 509, 512, or 607, respectively. Additionally, in system 500, it should be understood that one or more of the optical components of optical based subsystem 501 may move to move the stage 506 relative to the detector 509 or 512. Additionally in system 600, it should be understood that the electron beam may move (e.g., by magnetic bending) to move the stage 610 relative to the detector 607.

The stage 506 or 610 or the detector 509, 512, or 607 may move by using one or more actuators 516 or 611, respectively, operatively connected to the stage 506 or 610 or the detector 509, 512, or 607, respectively. Actuators 516 or 611 may comprise, for example, a servomotor, stepper motor, linear piston, hydraulic actuator, pneumatic actuator, magnetic actuator, etc.

Using an electron beam, the stage 610 may be fixed and electron beam deflection can be used to change positions of the electron beam on the wafer.

In this way, the system 500 or the system 600 may further configure a FOV at a first MTL of the first target disposed on the specimen 502 or 604, respectively. The first MTL may be determined by summing a first DTL and a navigational error provided by an online model.

In this way, the system 500 or the system 600 may be further configured to grab a first image of the FOV using the detector 509, 512, or 607, respectively.

In this way, the system 500 or the system 600 may further configure the FOV at a second MTL of the second target disposed on the specimen 502 or 604, respectively. The second MTL may be determined by summing a second DTL and a navigational error provided by an online model.

In this way, the system 500 or the system 600 may be further configured to grab a second image of the FOV using the detector 509, 512, or 607, respectively.

In this way, the system 500 or the system 600 may further configure a FOV at a third MTL of a third target disposed on the specimen 502 or 604, respectively. The third MTL may be determined by summing a third DTL and a navigational error provided by an online model.

In an instance, the processor 514 or the processor 608 may be in communication with the system 500 or the system 600, respectively. The processor 514 or the processor 608 may be configured to instruct the tool or the tool may receive instructions from another processor, system, or input.

In this way, the processor 514 or the processor 608 may be further configured to determine the position of a first ATL using the first image and update the online model with a difference between the first DTL and the first ATL. This may be concurrent with the configuration of the FOV at the second MTL.

In this way, the processor 514 or the processor 608 may be further configured to determine the position of a second ATL using the second image and update the online model with a difference between the second DTL and the second ATL. This may be concurrent with the configuration of the FOV at the third MTL.

System 500 or the system 600 may further configure the FOV at a third MTL before, while, or after the online model is updated with the difference between the first DTL and the first ATL.

Processor 514 or the processor 608 may be further configured to measure the overlay at the first or second target using the first or second image, respectively.

An additional embodiment may relate to a non-transitory computer-readable storage medium storing program instructions executable on a controller for performing a computer-implemented method for determining a height of an illuminated region on a surface of a specimen 502 or specimen 604, as disclosed herein. In particular, as shown in FIG. 5 or FIG. 6, electronic data storage unit 515 or electronic data storage unit 609, respectively or other storage medium may contain non-transitory computer-readable medium that includes program instructions executable on the processor 514 or the processor 608, respectively. The computer-implemented method may include any step(s) of any method(s) described herein, including methods 300 or 400, or sub-method 305.

In an embodiment, a non-transitory, computer-readable storage medium may contain one or more programs configured to execute steps on one or more processors.

The steps may include instructing a tool comprising a detector and a stage for holding a specimen. The specimen may have a first target and a second target disposed thereon. The steps may include instructing the tool to configure a field-of-view at a first modeled target location of the first target. The first modeled target location may be determined by summing a first design target location and a navigational error provided by an online model. The steps may further include instructing the tool to grab a first image of the field-of-view using the detector. The steps may further include instructing the tool to configure the field-of-view at a second modeled target location of the second target. The second modeled target location may be determined by summing a second design target location and the navigational error provided by the online model. Configuring the field-of-view may comprise moving the stage relative to the detector.

Concurrent with configuring the field-of-view at the second modeled target location, the steps may include determining the position of a first actual target location using the first image and updating the online model with a difference between the first design target location and the first actual target location.

The steps may further include instructing the tool to, after configuring the field-of-view at the second modeled target location, grab a second image of the field-of-view using the detector and configure the field-of-view at a third modeled target location of a third target disposed on the specimen. The third modeled target location may be determined by summing a third design target location and the navigational error provided by the online model.

Concurrent with configuring the field-of-view at the third modeled target location, the steps may include determining the position of a second actual target location using the second image and updating the online model with a difference between the second design target location and the second actual target location.

Program instructions implementing methods such as those described herein may be stored on computer-readable medium, such as in the electronic data storage unit 515 or the electronic data storage unit 609, or other storage medium. The computer-readable medium may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes (MFC), Streaming SIMD Extension (SSE), or other technologies or methodologies, as desired.

While some embodiments of the present disclosure may utilize targets used for measuring overlay, others may utilize targets dedicated to measurement of the navigational error. In such embodiments, for example, dedicated targets may be at the corners or edges of a die (e.g., the existing die corner marks). Three or more dedicated targets may be measured to determine the exact size and location of the die relative to the stage. A model may be built from the measured marks (e.g., a first-order polynomial model including translation, rotation, scale, and orthogonality). The design positions of measurement marks within the die may be corrected by applying the online model. The corrected design positions may be used for measurement. This process may be repeated for each die. This alternative example may also be used for single layer registration metrology.

The present disclosure may provide embodiments for dynamically updating and using an online model to predict target locations rather than a static model. Previous navigation errors may be used to predict navigation errors by reusing existing (e.g., secondary) measurement data (e.g., acquired target location) not used in previous processes. Throughput may be increased by allowing for the latency in the online model update—removing the requirement to wait for an update prior to moving to the next location in previous methods. The navigational drift model (e.g., the online model) may be updated in real-time (i.e., online) using measured data. Additional dedicated drift detection measurements can be added as input to the online model without changing some embodiments.

By employing embodiments of the claimed invention, tool performance can be improved (e.g., by reducing the impact of optical or e-beam distortion effects) and measurement time can be reduced (e.g., by reducing the overall need for extraneous scanning of an area to ensure a target is within a FOV of a system).

While images are specifically disclosed, other signal types also can benefit from the embodiments disclosed herein. For example, the embodiments disclosed herein can be used with line scans.

The steps of the method described in the various embodiments and examples disclosed herein are sufficient to carry out the methods of the present invention. Thus, in an embodiment, the method consists essentially of a combination of the steps of the methods disclosed herein. In another embodiment, the method consists of such steps.

Although the present disclosure has been described with respect to one or more particular embodiments, it will be understood that other embodiments of the present disclosure may be made without departing from the scope of the present disclosure.

What is claimed is:
1. A method, comprising:
providing a tool comprising a detector and a stage for holding a specimen;
using the tool:
configuring a field-of-view at a first modeled target location of a first target disposed on the specimen, wherein the first modeled target location is determined by summing a first design target location and a navigational error provided by an online model, wherein configuring the field-of-view comprises moving the stage relative to the detector;
grabbing a first image of the field-of-view using the detector; and
configuring the field-of-view at a second modeled target location of a second target disposed on the specimen, wherein the second modeled target location is determined by summing a second design target location and the navigational error provided by the online model; and
concurrent with configuring the field-of-view at the second modeled target location, using a processor:
determining a position of a first actual target location using the first image, wherein determining the position of the first actual target location at least partially overlaps with configuring the field of view at the second modeled target location; and
updating the online model with a difference between the first design target location and the first actual target location, wherein updating the online model with the difference between the first design target location and the first actual target location at least partially overlaps with configuring the field of view at the second modeled target location;
wherein the processor is in electronic communication with the tool.

2. The method of claim 1, further comprising, after configuring the field-of-view at the second modeled target location:
using the tool:
grabbing a second image of the field-of-view using the detector; and
configuring the field-of-view at a third modeled target location of a third target disposed on the specimen, wherein the third modeled target location is determined by summing a third design target location and the navigational error provided by the online model; and
concurrent with configuring the field-of-view at the third modeled target location, using the processor:
determining a position of a second actual target location using the second image, wherein determining the position of the second actual target location at least partially overlaps with configuring the field of view at the third modeled target location; and
updating the online model with a difference between the second design target location and the second actual target location, wherein updating the online model with the difference between the second design target location and the second actual target location at least partially overlaps with configuring the field of view at the third modeled target location.

3. The method of claim 2, wherein configuring the field-of-view at the third modeled target location is after updating the online model with the difference between the first design target location and the first actual target location.

4. The method of claim 2, wherein configuring the field-of-view at the third modeled target location is before updating the online model with the difference between the first design target location and the first actual target location.

5. The method of claim 1, further comprising updating the online model using secondary data.

6. The method of claim 1, wherein moving the stage relative to the detector comprises using an actuator to move the stage or the detector.

7. The method of claim 1, wherein the detector comprises an optical image detector and grabbing the first image includes receiving photons at the detector.

8. The method of claim 1, wherein the detector comprises an electron detector and grabbing the first image includes receiving electrons at the detector.

9. The method of claim 1, further comprising, using the first image, measuring the overlay for the first target.

10. A system, comprising:
a stage for holding a specimen, the specimen having a first target and a second target disposed thereon; and
a detector;
wherein the system is configured to:
configure a field-of-view at a first modeled target location of the first target, wherein the first modeled target location is determined by summing a first design target location and a navigational error provided by an online model;
grab a first image of the field-of-view using the detector;
configure the field-of-view at a second modeled target location at the second target, wherein the second modeled target location is determined by summing a second design target location and the navigational error provided by the online model; and
wherein configuring the field-of-view comprises moving the stage relative to the detector; and
a processor configured to, concurrent with configuring the field-of-view at the second modeled target location:
determine a position of a first actual target location using the first image, wherein determining the position of the first actual target location at least partially overlaps with configuring the field of view at the second modeled target location; and
update the online model with a difference between the first design target location and the first actual target location, wherein updating the online model with the difference between the first design target location and the first actual target location at least partially overlaps with configuring the field of view at the second modeled target location;
wherein the processor is in electronic communication with the detector.

11. The system of claim 10, wherein:
the system is further configured to, after configuring the field-of-view at the second modeled target location:
grab a second image of the field-of-view using the detector; and
configure the field-of-view at a third modeled target location of a third target disposed on the specimen, wherein the third modeled target location is determined by summing a third design target location and the navigational error provided by the online model; and
the processor is further configured to, concurrent with configuring the field-of-view at the third modeled target location:
determine a position of a second actual target location using the second image, wherein determining the position of the second actual target location at least partially overlaps with configuring the field of view at the third modeled target location; and
update the online model with a difference between the second design target location and the second actual target location, wherein updating the online model with the difference between the second design target location and the second actual target location at least partially overlaps with configuring the field of view at the third modeled target location.

12. The system of claim 11, wherein the system configures the field-of-view at the third modeled target location after updating the online model with the difference between the first design target location and the first actual target location.

13. The system of claim 11, wherein the system configures the field-of-view at the third modeled target location before updating the online model with the difference between the first design target location and the first actual target location.

14. The system of claim 10, wherein the processor is configured to update the online model using secondary data.

15. The system of claim 10, wherein the system further comprises an actuator operatively connected to the stage or the detector and the actuator is configured to move the stage relative to the detector.

16. The system of claim 10, wherein the detector comprises an optical image detector configured to grab the first image by receiving photons.

17. The system of claim 10, wherein the detector comprises an electron detector configured to grab the first image by receiving electrons.

18. The system of claim 10, wherein the processor is further configured to, using the first image, measure the overlay for the first target.

19. A non-transitory, computer-readable storage medium containing one or more programs configured to execute the following steps on one or more processors:
instruct a tool comprising a detector and a stage for holding a specimen, the specimen having a first target and a second target disposed thereon, to:
configure a field-of-view at a first modeled target location of the first target, wherein the first modeled target location is determined by summing a first design target location and a navigational error provided by an online model;
grab a first image of the field-of-view using the detector;
configure the field-of-view at a second modeled target location of the second target, wherein the second modeled target location is determined by summing a second design target location and the navigational error provided by the online model; and
wherein configuring the field-of-view comprises moving the stage relative to the detector; and
concurrent with configuring the field-of-view at the second modeled target location:
determine a position of a first actual target location using the first image, wherein updating the online model with the difference between the first design target location and the first actual target location at least partially overlaps with configuring the field of view at the second modeled target location; and
update the online model with a difference between the first design target location and the first actual target location, wherein updating the online model with the difference at least partially overlaps with configuring the field of view at the second modeled target location.

20. The non-transitory, computer-readable storage medium of claim 19, wherein the one or more programs are configured to further execute the following steps on the one or more processors after configuring the field-of-view at the second modeled target location:

instruct the tool to:
  grab a second image of the field-of-view using the detector; and
  configure the field-of-view at a third modeled target location of a third target disposed on the specimen, wherein the third modeled target location is determined by summing a third design target location and the navigational error provided by the online model; and
concurrent with configuring the field-of-view at the third modeled target location:
  determine a position of a second actual target location using the second image, wherein determining the position of the second actual target location at least partially overlaps with configuring the field of view at the third modeled target location; and
  update the online model with a difference between the second design target location and the second actual target location, wherein updating the online model with the difference between the second design target location and the second actual target location at least partially overlaps with configuring the field of view at the third modeled target location.

\* \* \* \* \*